US006752643B2

United States Patent
Hisaishi et al.

(12)
(10) Patent No.: US 6,752,643 B2
(45) Date of Patent: Jun. 22, 2004

(54) KGD CARRIER AND AN IC MOUNTING SOCKET MOUNTING IT

(75) Inventors: Minoru Hisaishi, Tokyo (JP); Noriyuki Matsuoka, Yokohama (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 10/290,230

(22) Filed: Nov. 8, 2002

(65) Prior Publication Data

US 2003/0092301 A1 May 15, 2003

(30) Foreign Application Priority Data

Nov. 12, 2001 (JP) ........................................ 2001-346330

(51) Int. Cl.[7] .............................................. H01R 11/22
(52) U.S. Cl. ...................................... 439/266; 439/526
(58) Field of Search ................................ 439/266, 264, 439/526, 71, 73

(56) References Cited

U.S. PATENT DOCUMENTS 3,746,157 A * 7/1973 I'Anson ...................... 206/724
4,886,470 A * 12/1989 Billman et al. ............. 439/266

* cited by examiner

*Primary Examiner*—Javaid H. Nasri
(74) *Attorney, Agent, or Firm*—Finnegan, Henderson, Farabow, Garrett & Dunner, LLP.

(57) ABSTRACT

A KGD carrier holds the IC chip by means of a carrier retaining member and a carrier base assembly. The carrier base assembly includes a carrier body, a carrier base and a substrate. The carrier body is provided with grooves, which are located opposing to pads formed on a peripheral portion of the substrate, to permit the in-and-out motion of contacts of the IC socket. The carrier base is provided with the grooves, which are located opposing to the pads formed on the peripheral portion of the substrate, to permit the in-and-out motion of the contacts of the IC socket. The substrate is interposed between the carrier body and the carrier base so as to enable the pads of the substrate and the corresponding contacts of the IC socket to be electrically connected with each other.

8 Claims, 6 Drawing Sheets

KGD CARRIER AND AN IC MOUNTING SOCKET MOUNTING IT

This application is based on Patent Application No. 2001-346330 filed Nov. 12, 2001 in Japan, the content of which is incorporated hereinto by reference.

BACKGROUND OF THE INVENTION

1. Field of the Invention

The present invention relates to a KGD carrier, more particularly to a KGD carrier having the structure around the substrate thereof improved and an IC socket for mounting the KGD carrier.

2. Description of the Related Art

In the conventional way, when subjecting a non-package chip (or die) satisfying the given specifications, i.e., a KGD (Known Good Die), to the burn-in test, it has been a common practice that the KGD to be tested is once mounted on a special carrier, and the carrier mounted with the KGD is then mounted on an IC socket. Then, the IC socket is incorporated into a test board to undergo the burn-in test.

The structure of a conventional KGD carrier for mounting the KGD will be described briefly referring to FIG. 5. FIG. 5 shows a cross-sectional view of the carrier mounted with an IC chip.

The KGD carrier 10 comprises a carrier retaining member 20 and a carrier base assembly 30.

The carrier retaining member 20 comprises a cover 21, a chip retaining member 22, a coil spring 23 and a steel ball 24 so that the IC chip 40 placed on the carrier base assembly 30 can be held elastically.

The carrier substrate 30 comprises a carrier body 31 including a latch 36 for locking the carrier retaining member 20 with the carrier base assembly 30, a substrate (a contact seat) 32 as being a printed-circuit board, an elastomer frame 33, an elastomer 34 as being a cushion to be placed in the elastomer frame 33, and a carrier base 35. The carrier body 31, the substrate 32, the elastomer frame 33 and the carrier base 35 are integrated into a single body by using screws or the like (not shown) to form a carrier base assembly 30. The film-like substrate 32 needs to be kept open so that the pad 32a placed therearound can electrically be connected with the contact of the IC socket. Therefore, in order to prevent the substrate 32, especially the peripheral portion thereof, from becoming saggy, the substrate 32 is previously bonded to the elastomer frame 33 (or to the carrier base 35 if the elastomer frame 33 is omitted) or to the carrier body 31.

The IC chip 40 is mounted on the carrier 10 in a fashion described below. First, while the carrier retaining member 20 is removed, the IC chip 40 is placed on the substrate 32. Subsequently, the carrier retaining member 20 is used to press the IC chip 40 inward evenly and elastically until coming into close contact with the substrate 32, thereby enabling the IC chip 40 and the substrate 32 to be electrically connected with each other. Further, the latch 36 is made to engage with a cover 21 of the carrier retaining member 20 to complete the mounting of the IC chip 40 as illustrated in FIG. 5.

The carrier 10 mounted with the IC chip 40 is further mounted on an IC socket 50 as is shown in FIG. 6.

The IC socket 50 comprises an operating cover 51, a socket base 52 and a contact 53 which includes a contact portion 53a, an elastic portion 53b, a stationary portion 53c and a terminal portion 53d. The IC socket 50 is designed so that the contact portion 53a of the contact 53 moves back away from and forth toward a pad 32a, which is formed on the substrate 32 of the carrier 10 mounted on the IC socket 50, as the operating cover 51 moves up and down.

In order for the carrier 10 to be mounted on the IC socket 50, the operating cover 51 needs to be pushed downward to make the contact portion 53a of the contact 53 to retreat. Then the carrier 10 enables to be positioned and placed on a mounting base 52a of the socket base 52. Subsequently, when the downward pushing force of the operating cover 51 is released, the operating cover 51 rises because of the restoring force of the spring (not shown). Then, the contact portion 53a of the contact 53 returns to its original position and abuts the pad 32a of the substrate 32 of the carrier 10. Consequently, the substrate 32 (i.e., the IC chip 40) is electrically connected with the contact 53.

The IC chip 40, mounted on the IC socket 50 through the carrier 10 in the previously described manner, is then set in a test board (not shown) to undergo the burn-in test.

As described previously, in the case of the conventional carrier 10, the substrate 32 is bonded to the elastomer frame 33 and the carrier base 35 or the carrier body 31, so that, for example as shown in FIG. 6, the substrate 32 is in contact with the contact 53 of the IC socket 50 only at one point, which may result in unstable electrical connection.

In consideration of the point discussed above, the present invention is designed to provide a KGD carrier capable of obtaining sure electric connection by enabling the substrate of the KGD carrier base assembly and the contact of the IC socket to contact with each other at 2 points.

SUMMARY OF THE INVENTION

In order to attain the above object, the KGD carrier according to the present invention is designed to hold the IC chip by means of the carrier retaining member and the carrier base assembly. The carrier base assembly comprises the carrier body, the carrier base and the substrate. The carrier body is provided with grooves, which are located opposing pads formed around the substrate, to permit the in-and-out motion of contacts of the IC socket. The carrier base is also provided with grooves, which are located opposing the pads formed around the substrate, to permit the in-and-out motion of the contacts of the IC socket. The substrate is interposed between the carrier body and the carrier base to enable the pads and the corresponding contacts to be connected electrically with each other.

The above and other objects, effects, features and advantages of the present invention will become more apparent from the following description of embodiments thereof taken in conjunction with the accompanying drawings.

BRIEF DESCRIPTION OF THE DRAWINGS

FIG. 1A is a partial cross sectional view of the KGD carrier mounted with the IC chip, while FIG. 1B is an enlarged partial cross sectional view taken along A—A line in FIG. 1A;

DETAILED DESCRIPTION OF PREFERRED EMBODIMENTS

Figure 1A:
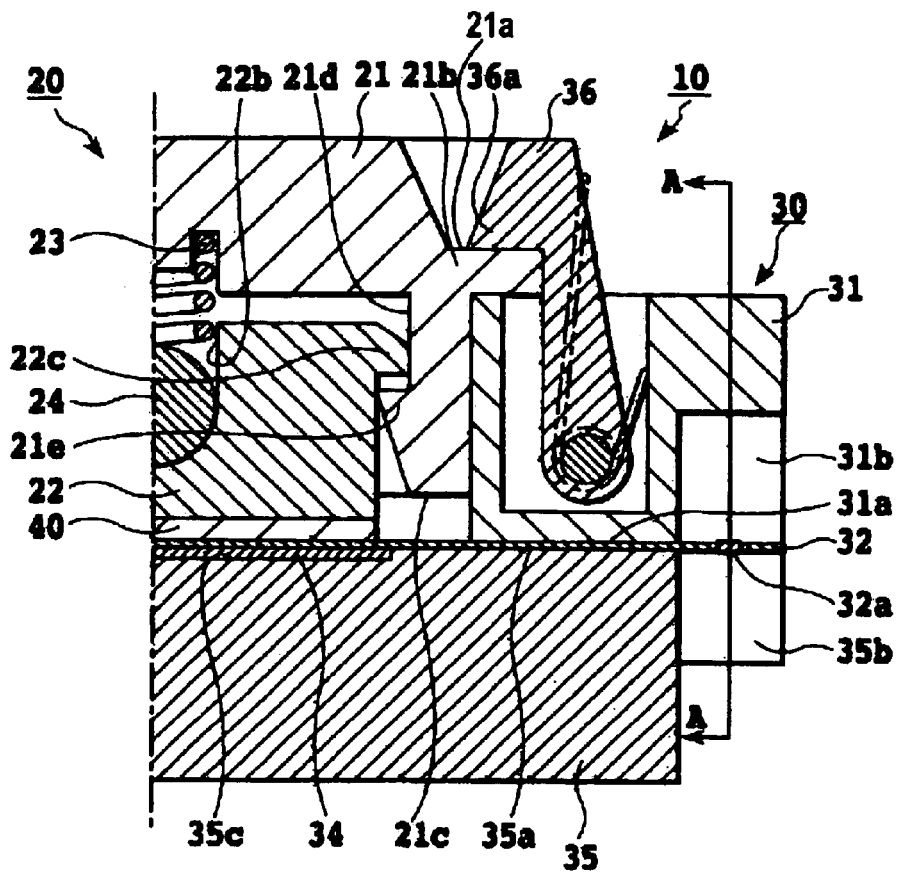
FIGS. 1A and 1B show the principal parts of the KGD carrier according to the present invention respectively.
Figure 1B:
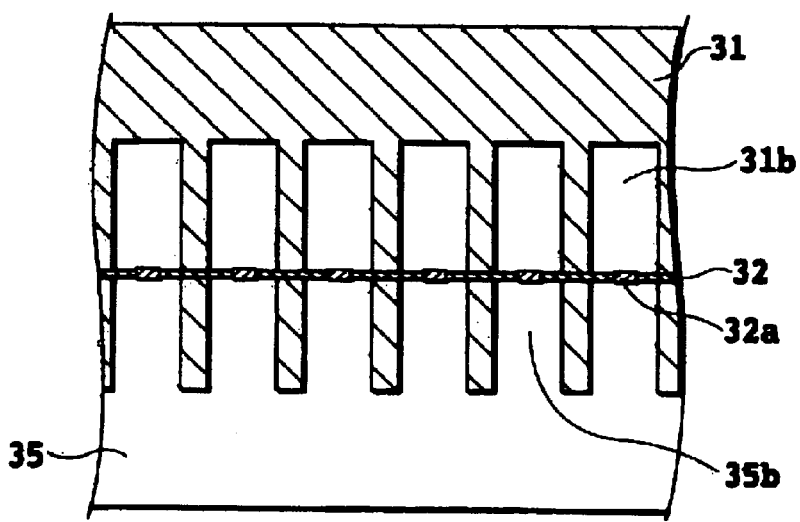

The KGD carrier as an embodiment of the present invention will be described referring with FIG. 1. FIG. 1A is a partial (right-side half) cross sectional view of the KGD carrier, while FIG. 1B is an enlarged partial cross sectional view taken along A—A line in FIG. 1A. The reference numerals alike those in referred prior art correspond to similar parts of the present invention.

The KGD carrier 10 comprises the carrier retaining member 20 and the carrier base assembly 30.

The carrier retaining member 20 comprises the cover 21, the chip retaining member 22, the coil spring 23 and the steel ball 24.

On the both sides of a top surface 21a of the cover 21 there are provided two (a pair of) engaging portions 21b, which respectively engage with the two engaging hooks 36a of the two latches 36 provided with the carrier body 31, which will be described later. Further, on a bottom surface 21c (of the cover 21) side there is provided a space 21d for containing the chip retaining member 22 and other members.

The chip retaining member 22 is contained in the space 21d under the cover 21 so as to be able to move up and down freely through the coil spring 23 and the steel ball 24. The coil spring 23 is provided to force the chip retaining member 22 downward and the steel ball 24 is provided for enabling the chip retaining member 22 to swing to some extent so that the IC chip 40 can be pressed evenly against the substrate 32. Further, between the chip retaining member 22 and the space 21d under the cover 21, there are provided engaging mechanisms 21e and 22c so that the chip retaining member 22 can be prevented from getting out of the space 21d under the cover 21. The engaging mechanisms 21e and 22c are provided with the side walls of the space 21d under the cover 21 and the side wall of the chip retaining member 22 respectively. Further, the steel ball 24 is fitted into a recessed space 22b beginning from the upper surface of the chip retaining member 22 and is in contact with open end of the coil spring 23.

The carrier base assembly 30 comprises the carrier body 31 including a pair of latches 36 for locking the carrier retaining member 20 with the carrier base assembly 30, the substrate (contact sheet) 32 as being a printed-circuit board, the carrier base 35 and the elastomer 34 as being the cushion to be placed in the recess 35a of the carrier base 35. The carrier body 31, the substrate 32 and the carrier base 35 are integrated into a carrier base assembly 30 by means of the screws (not shown) or the like.

The bottom surface 31a of the carrier body 31 is substantially flat (having a substantially rectangular area) as equally as the substrate 32. The grooves 31b are formed at least opening sideways and downward on both side walls of the bottom surface 31a, that is, the positions opposite to the place where the pads 32a of the substrate 32 are located. The grooves 31b are formed so that each groove has the width sufficient for permitting the in-and-out motion of the moving contact portion 53a of the contact 53 of the IC socket, which will be described later. The grooves 31b are also formed in plural number corresponding to the number of contacts 53 and like the teeth of a comb in parallel with one another as shown in FIG. 1B. Further, the grooves 31b may be formed opening upward. The top surface 35a of the carrier base 35 is substantially flat as equally as the surface of the substrate 32. The grooves 35b are formed at least opening sideways and upward in the walls on both sides of the top surface 35a and opposite to the grooves 31b formed with the carrier body 31 (i.e., in the positions opposite to the pad 32a of the substrate 32). The grooves 35b are formed so that each groove has the width sufficient for permitting the in-and-out motion of stationary contact 53"a of the contact 53 of the IC socket 50 described later. The grooves 35b are formed in parallel to one another like the teeth of a comb similarly to the case of the previously described grooves 31b. Further, it is preferred that the grooves 35b are formed opening downward too as shown in the figure.

In the present embodiment, the pads 32a of the substrate 32 are provided in plurality along the periphery of the substrate 32. Each of the pads 32a is provided so as to form its contact portions on both the upper side and the underside of the substrate 32.

Figure 3:
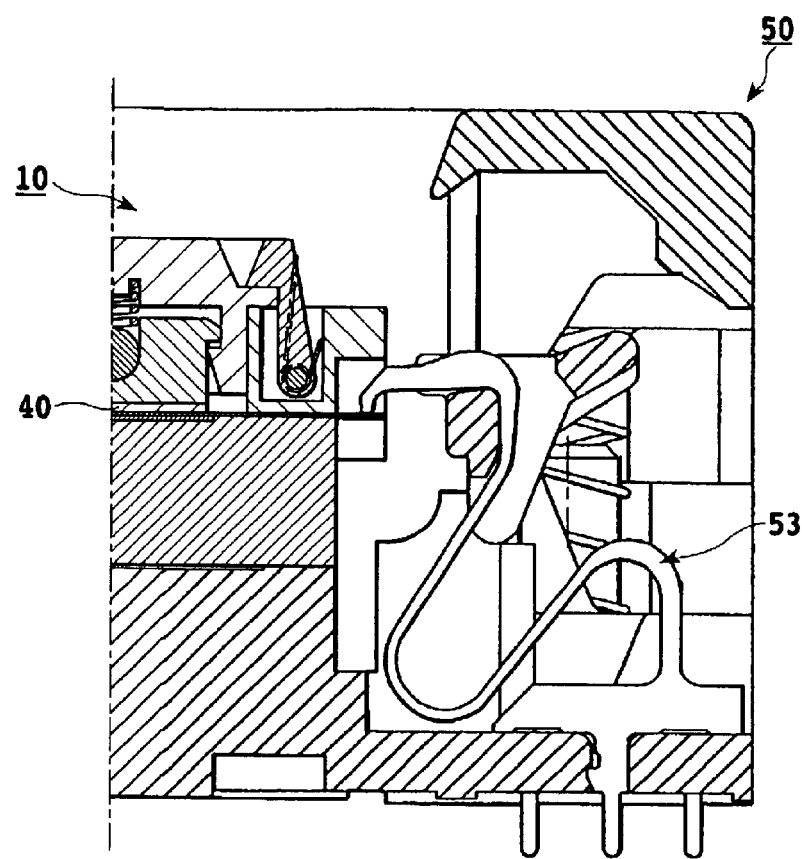
FIG. 3 is a partial cross sectional view of the 1-contact-point type IC socket mounted with the KGD carrier according to the present invention mounted with the IC chip.
Figure 4:
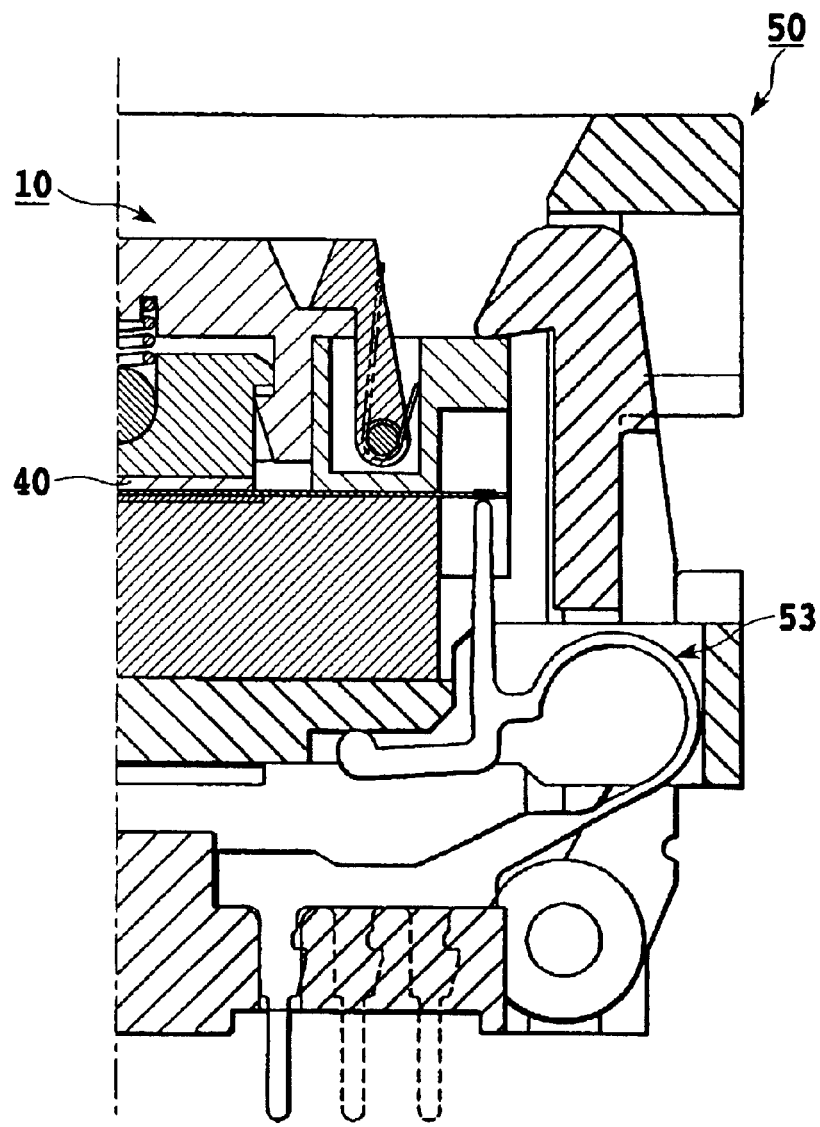
FIG. 4 is a partial cross sectional view of another 1-contact-point type IC socket mounted with the KGD carrier according to the present invention mounted with the IC chip.
Figure 5:
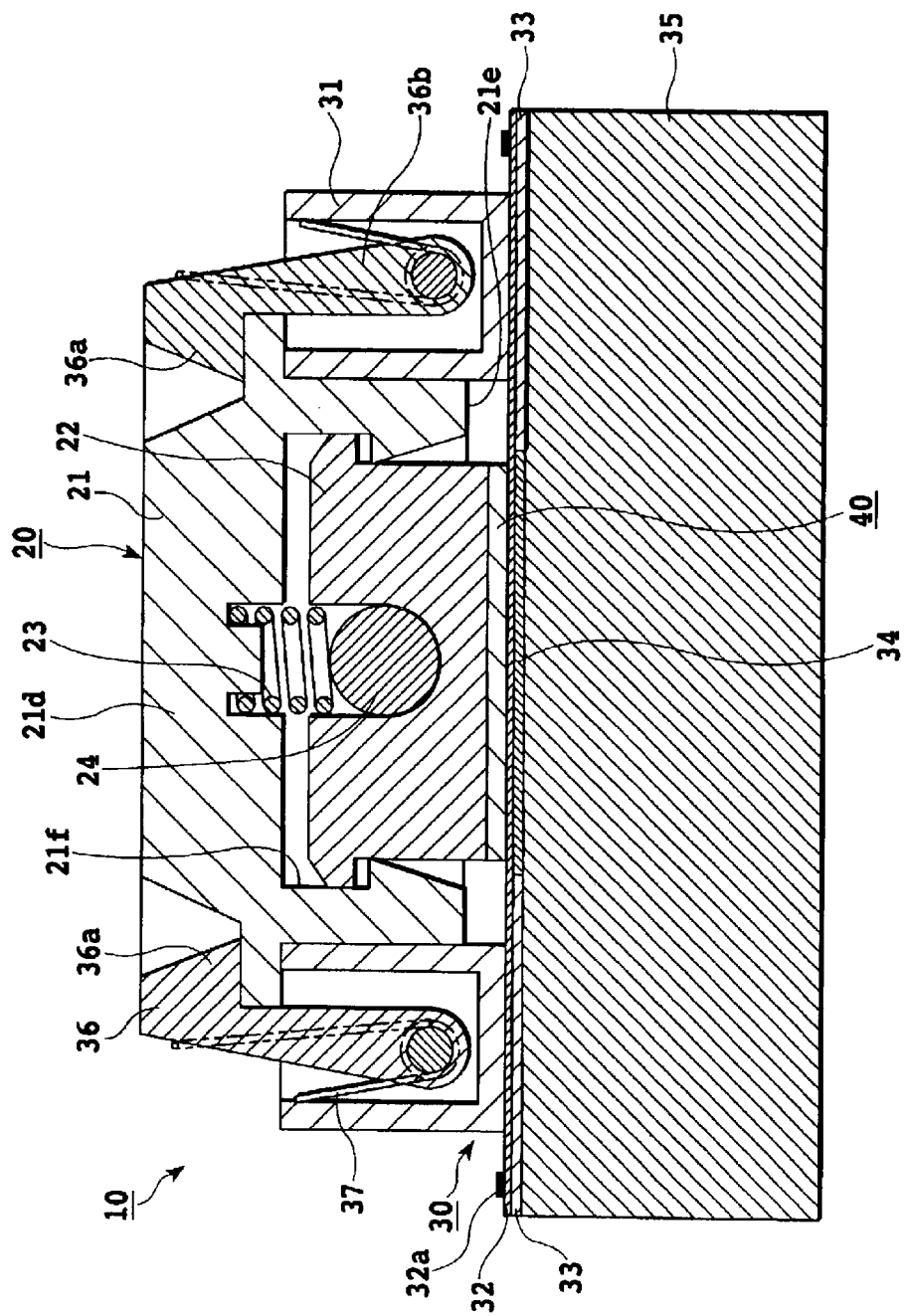
FIG. 5 is a partial cross sectional view of a conventional carrier mounted with the IC chip.
Figure 6:
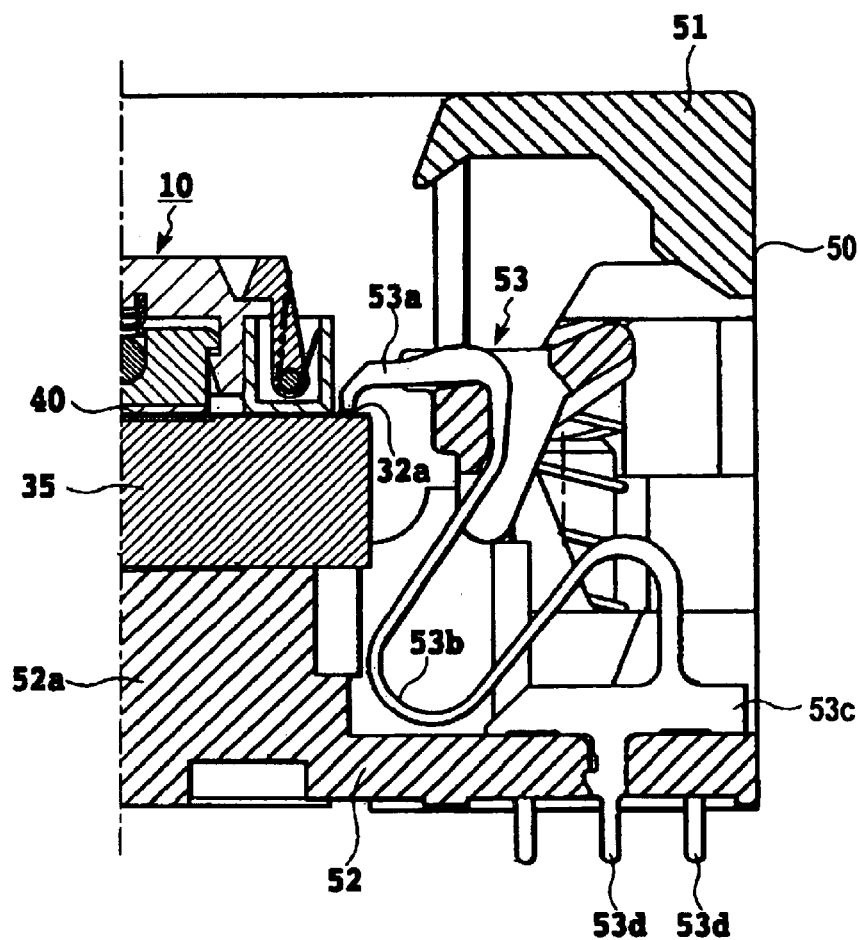
FIG. 6 is a partial cross sectional view of an IC socket mounted with a conventional carrier which is mounted with the IC chip.

Further, the substrate 32, unlike the case of the prior art, is interposed between the carrier body 31 and the carrier base 35 to be wholly supported. In this case, since the previously described grooves 31b and 35b are formed with the carrier body 31 and the carrier base 35, the contact portion of the contact 53 is permitted to come in the vicinity of the pad 32a of the substrate 32, which is interposed between the carrier body 31 and the carrier base 35, both from above and from below. This means that, if the interval pitch of the pad of the substrate coincides with the interval pitch of the contact, the conventional 1-point-contact type IC socket can be used (Refer to FIGS. 3 and 4). Further, in this case, the pad to be formed does not need be exposed on both the upper side and underside of the substrate. That is, the conventional substrate with the pad formed on either side (of the substrate) can also be used.

Incidentally, in the peripheral portion where the pad 32a of the substrate 32 is formed, the part corresponding to the grooves 31b and 35b is left free. However, the peripheral portion of the substrate 32, not including the portion where the pad is formed, is not only interposed between the walls separating the neighboring grooves but also the intervals of the separating walls are narrow. Then, the pad can be prevented from being bent or becoming loose. Therefore, the substrate 32 need not necessarily be bonded to the carrier body 31 or the carrier base 35 unlike the case of the prior art. This makes the replacement of the substrate 32 easier.

The mounting of the IC chip 40 on the carrier 10 can be made in the manner similar to that in the case of the prior art. That is, the IC chip 40 mounted on the substrate 32 of the carrier base assembly 30 is not only elastically held between the substrate 32 and the chip retaining member 22 of the carrier retaining member 20 but also is electrically connected with the substrate 32.

Figure 2:
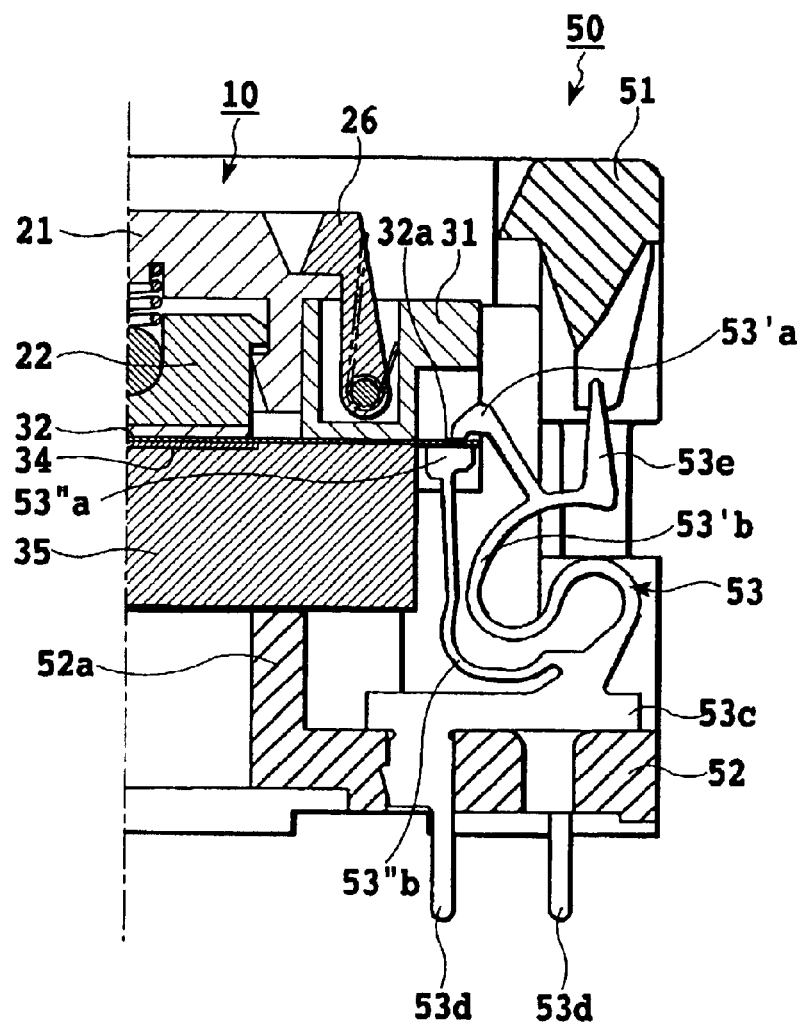
FIG. 2 is a partial cross sectional view of the 2-contact-point type IC socket mounted with the KGD carrier according to the present invention mounted with the IC chip.

The carrier 10 mounted with the IC chip 40 is further mounted on the IC socket 50 as shown in FIG. 2.

The IC socket 50 comprises the operating cover 51, the socket base 52 and a plurality of contacts 53. Each of the contacts includes the two contact portions 53'a and 53e (i.e., the moving contact portion 53'a and the stationary contact portion 53"a), the two elastic portions 53'b and 53"b which follow the moving contacts 53'a and the 53"a respectively, the stationary portion 53c for fixing the contact 53 to the socket base 52, the terminal portion 53d which is electrically connected with the test board, and portion 53e to engage with operating cover 51.

The moving contact portion 53'a, one of the contact portions of the contact 53, is designed to follow the up-and-down motion of the operating cover 51 so as to move back away from and forth toward the pad 32a formed with the substrate 32 of the carrier 10 to be mounted. Further, the stationary contact portion 53"a, another of the contact portions of the contact 53, is extended out of the stationary portion 53c through the elastic portion 53"b so as to be able to move up and down. However, the stationary contact portion 53"a will not move following the motion of the operating cover 51 (and others), thereby actually functioning as a stationary contact.

To mount the carrier 10 on the IC socket 50, the operating cover 51 is pushed downward to let the moving contact portion 53'a of the contact 53 retreat, and the carrier 10 is positioned on the mounting base 52a of the socket base 52 to be mounted. Portion 53e engages with an underside of operating cover 51, so that when operating cover moves downward, contact 53 to retreats. In this case, since carrier base 35 comprises the grooves 35b for permitting the in-and-out motion of the stationary contact portion 53"a is permitted to pass the inside of the groove 35b to contact the under surface of the pad 32a formed with the substrate 32.

Subsequently, releasing the downward force of the operating cover 51 causes the operating cover 51 to rise owing to the restoring force of the spring (not shown), thereby causing the moving contact portion 53'a of the contact 53 to return to its original position. In this case, since the carrier body 31 comprises the grooves 31b so as to permit the in-and-out motion of the moving contact portion 53'a of the contact 53, the moving contact portion 53'a comes into contact with the upper surface of the pad 32a that is formed with the substrate 32 of the mounted carrier 10. Whereby, the substrate 32 (i.e., the IC chip 40) and the contact 53 are electrically connected with each other. Further, as described previously, one pad 32a of the substrate 32 comes into contact with the two contact portions of the contact 53, which results in surer electric connection.

In this way, the IC chip 40, which is mounted on the IC socket 50 through the carrier 10, is then set on the test board (not shown) for undergoing the burn-in test.

As discussed in the foregoing, the KGD carrier according to the present invention is designed so that the substrate is interposed between the carrier body and the carrier base in order to enable to electrically connect between the pad of the substrate and the contact of the IC socket. Therefore, the substrate and the contact enable to come into contact with each other at two points for obtaining surer electrical connection. Further, the KGD carrier according to the present invention is also applicable to the conventional 1-point-contact type IC socket.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A KGD carrier designed for mounting on an IC socket and for holding an IC chip by means of a carrier retaining member and a carrier base assembly which comprises a carrier body, a carrier base and a substrate;

wherein the carrier body is provided with grooves, which are located at a first position opposite to pads formed on a peripheral portion of the substrate, to permit the in-and-out motion of contacts of the IC socket;

the carrier base is provided with grooves, which are located at a second position opposite to the pads formed on the peripheral portion of the substrate, to permit the in-and-out motion of the contacts of the IC socket;

the substrate is interposed between the carrier body and the carrier base so as to enable the pads and the corresponding contacts to be electrically connected with each other.

2. The KGD carrier as claimed in claim 1, wherein said grooves of said carrier body are formed at least opening sideways and downward with respect to said carrier body.

3. The KGD carrier as claimed in claim 2, wherein the grooves of said carrier body are also formed opening upward with respect to the carrier body.

4. The KGD carrier as claimed in claim 1, wherein the grooves of said carrier base are formed at least opening sideways and upward with respect to said carrier base.

5. The KGD carrier as claimed in claim 4, wherein the grooves of said carrier base are also formed opening downward with respect to said carrier base.

6. The KGD carrier as claimed in claim 1, wherein said carrier retaining member comprises a cover and the chip retaining member which is contained in a space on the bottom surface side of the cover permit an up and down movement with respect to the cover by means of a coil spring.

7. An IC socket, comprising a socket base, a KGD carrier mounted on the socket base, an operating cover disposed above the socket base so as to be able to move up and down freely, and contacts fixed to the socket base so that a contact portion thereof is able to move back away from and forth toward the KGD carrier according to movement of the operating cover, wherein the KGD carrier holds an IC chip by means of a carrier retaining member and a carrier base assembly;

the carrier base assembly includes a carrier body, a carrier base and a substrate;

the carrier body is provided with grooves, which are located at a first position opposite to pads formed on a peripheral portion of the substrate, to permit the in-and-out motion of contacts of the IC socket;

the carrier base is provided with grooves, which are located at a second position opposite to the pads formed on the peripheral portion of the substrate, to permit the in-and-out motion of the contacts of the IC socket;

the substrate is interposed between said carrier body and the carrier base so as to enable the pads and the corresponding contacts to be connected electrically with each other.

8. The IC socket as claimed in claim 7, wherein each of said contacts comprises 2 contact portions which are arranged so as to come into contact with both the upper surface and the under surface of the corresponding pad of said substrate.

* * * * *

UNITED STATES PATENT AND TRADEMARK OFFICE
CERTIFICATE OF CORRECTION

PATENT NO.   : 6,752,643 B2
DATED        : June 22, 2004
INVENTOR(S)  : Minoru Hisaishi et al.

It is certified that error appears in the above-identified patent and that said Letters Patent is hereby corrected as shown below:

<u>Column 6,</u>
Line 30, "cover permit" should read -- cover to permit --.

Signed and Sealed this

Fifteenth Day of March, 2005

JON W. DUDAS
*Director of the United States Patent and Trademark Office*